United States Patent
Lin et al.

(10) Patent No.: US 12,080,608 B2
(45) Date of Patent: Sep. 3, 2024

(54) SELF-LIMITING MANUFACTURING TECHNIQUES TO PREVENT ELECTRICAL SHORTS IN A COMPLEMENTARY FIELD EFFECT TRANSISTOR (CFET)

(71) Applicant: Synopsys, Inc., Mountain View, CA (US)

(72) Inventors: Xi-Wei Lin, Fremont, CA (US); Victor Moroz, Saratoga, CA (US)

(73) Assignee: Synopsys, Inc., Sunnyvale, CA (US)

( * ) Notice: Subject to any disclaimer, the term of this patent is extended or adjusted under 35 U.S.C. 154(b) by 202 days.

(21) Appl. No.: 17/372,254

(22) Filed: Jul. 9, 2021

(65) Prior Publication Data
US 2022/0020647 A1    Jan. 20, 2022

Related U.S. Application Data

(60) Provisional application No. 63/053,503, filed on Jul. 17, 2020.

(51) Int. Cl.
*H01L 21/8238* (2006.01)
(52) U.S. Cl.
CPC ............ *H01L 21/823871* (2013.01); *H01L 21/823885* (2013.01)
(58) Field of Classification Search
CPC ..... H01L 21/823871; H01L 21/823885; H01L 29/42392; H01L 21/8238
See application file for complete search history.

(56) References Cited

U.S. PATENT DOCUMENTS 9,397,049 B1    7/2016    Fan et al.
9,653,575 B1    5/2017    Basker et al.
(Continued)

FOREIGN PATENT DOCUMENTS

EP    3675158 A2    7/2020
TW    201635493 A    10/2016
(Continued)

OTHER PUBLICATIONS

Ryckaert, J et al, "The Complementary FET (CFET) for CMOS scaling beyond N3", 2018 IEEE Symposium on VLSI Technology, IEEE, Jun. 18, 2018, pp. 141-142.

*Primary Examiner* — Jay C Kim
*Assistant Examiner* — Woo K Lee
(74) *Attorney, Agent, or Firm* — Haynes Beffel & Wolfeld LLP; Andrew L. Dunlap; Korbin S. Van Dyke

(57) ABSTRACT

A method of forming a complementary field effect transistor (CFET) is provided. The method includes adding a blocking material to a vertical channel of the CFET having an epitaxial growth, the blocking material being located below and in contact with a lower portion of the growth, adding an insulating material to an open area within the vertical channel to surround a portion of the epitaxial growth, performing an etch to (i) remove a portion of the insulating material, (ii) expose a contact surface of the epitaxial growth and (iii) provide a vertical opening within the vertical channel, the etch leaving a portion of the blocking material, and filling in the vertical opening with a conductive material, the conductive material reaching the exposed contact surface of the epitaxial growth, the blocking material remaining below the conductive material to prevent contact between the conductive material and a silicon substrate below the growth.

16 Claims, 10 Drawing Sheets

(56) References Cited

U.S. PATENT DOCUMENTS

| | | |
|---|---|---|
| 10,177,227 B1 | 1/2019 | Yoshida et al. |
| 10,236,217 B1 | 3/2019 | Ando et al. |
| 10,236,292 B1 | 3/2019 | Frougier et al. |
| 10,256,158 B1 | 4/2019 | Frougier et al. |
| 10,269,929 B2 | 4/2019 | Wostyn et al. |
| 10,388,519 B2 | 8/2019 | Smith et al. |
| 10,546,925 B2 | 1/2020 | Reznicek et al. |
| 10,833,003 B1 | 11/2020 | Chou et al. |
| 11,227,922 B2 | 1/2022 | Li et al. |
| 2009/0014806 A1 | 1/2009 | Ostermayr et al. |
| 2009/0081815 A1 | 3/2009 | Yamashita et al. |
| 2010/0237406 A1 | 9/2010 | Oyu |
| 2011/0003256 A1 | 1/2011 | Van Der Heijden et al. |
| 2015/0333131 A1 | 11/2015 | Mojumder et al. |
| 2016/0247722 A1 | 8/2016 | Zhang et al. |
| 2018/0026042 A1 | 1/2018 | Smith et al. |
| 2018/0374791 A1 | 12/2018 | Smith et al. |
| 2019/0051523 A1 | 2/2019 | Huang et al. |
| 2019/0057867 A1 | 2/2019 | Smith et al. |
| 2019/0109136 A1 | 4/2019 | Ching et al. |
| 2019/0131184 A1 | 5/2019 | Ando et al. |
| 2019/0172755 A1 | 6/2019 | Smith et al. |
| 2019/0288004 A1 | 9/2019 | Smith et al. |
| 2020/0035569 A1 | 1/2020 | Frougier et al. |
| 2020/0105671 A1 | 4/2020 | Lai et al. |
| 2020/0111670 A1 | 4/2020 | Huang et al. |
| 2021/0098294 A1 | 4/2021 | Smith et al. |
| 2021/0098306 A1* | 4/2021 | Smith ............ H01L 21/823475 |
| 2021/0202500 A1 | 7/2021 | Chanemougame et al. |
| 2021/0366907 A1 | 11/2021 | Liao et al. |
| 2022/0020647 A1 | 1/2022 | Lin et al. |
| 2022/0037497 A1 | 2/2022 | Chung et al. |
| 2022/0157936 A1 | 5/2022 | Khaderbad et al. |
| 2022/0165730 A1 | 5/2022 | Chen et al. |

FOREIGN PATENT DOCUMENTS

| | | |
|---|---|---|
| TW | 201913821 A | 4/2019 |
| TW | 201917893 A | 5/2019 |
| TW | 201937611 A | 9/2019 |
| TW | 201939747 A | 10/2019 |
| TW | 202018825 A | 5/2020 |
| TW | 202025448 A | 7/2020 |
| WO | 2020065916 A1 | 4/2020 |
| WO | 2020137660 A1 | 7/2020 |

* cited by examiner

SELF-LIMITING MANUFACTURING TECHNIQUES TO PREVENT ELECTRICAL SHORTS IN A COMPLEMENTARY FIELD EFFECT TRANSISTOR (CFET)

RELATED APPLICATION

This application claims priority under 35 U.S.C. § 119(e) to U.S. Provisional Application No. 63/053,503, entitled "SELF-LIMITING TECHNIQUES TO IMPROVE ROBUSTNESS OF THE MANUFACTURING PROCESS OF A COMPLEMENTARY FIELD EFFECT TRANSISTOR (CFET)", filed on Jul. 17, 2020.

TECHNICAL FIELD

The present disclosure relates to minimizing a potential of shorting contacts when manufacturing a complementary field effect transistor (CFET).

BACKGROUND

Transistor stacking, such as the stacking implemented in a complementary field effect transistor (CFET), is a candidate for transistor density scaling and sustainment of Moore's Law in the next 5-10 years. The concept behind CFET is to scale in 3D, by stacking one transistor on another vertically, resulting in density doubling with the same feature size. This CFET architecture requires innovative methods of manufacturing that have not been implemented when manufacturing a single transistor stack.

SUMMARY

The technology disclosed implements an etch-stop at a bottom of a source and/or drain epitaxy on a lower level of a complementary field effect transistor (CFET) and implements an etch-stop over a buried power rail (BPR) of the CFET in order to prevent the formation of unintentional electrical connections and/or electrical shorts.

In an implementation, a method of forming a complementary field effect transistor (CFET) is provided. The method can include adding a blocking material to a vertical channel of an unfinished CFET structure having a lower level silicon epitaxial growth in a lower level thereof, the blocking material being located below and in contact with a lower portion of the lower level silicon epitaxial growth, adding an insulating material to an open area within the vertical channel to surround a portion of at least the lower level silicon epitaxial growth, performing a first etch to (i) remove a portion of the added insulating material, (ii) expose a contact surface of the lower level silicon epitaxial growth and (iii) provide a vertical opening within the vertical channel, the first etch leaving at least a portion of the blocking material, and filling in the vertical opening with a conductive material, the conductive material reaching the exposed contact surface of the lower level silicon epitaxial growth, the blocking material remaining below the conductive material to prevent contact between the conductive material and a silicon substrate located below the lower level silicon epitaxial growth.

In a further implementation, the vertical channel can be formed by a vertical divider.

In another implementation, wherein the open area, to which the insulating material is added, can be adjacent to the vertical divider.

In an implementation, the insulating material can be added to the open area to surround a portion of an upper level silicon epitaxial growth in an upper level of the unfinished CFET structure.

In a further implementation, the first etch can further remove a portion of the added insulating material to expose a contact surface of the upper level silicon epitaxial growth.

In another implementation, wherein the conductive material can reach the exposed contact surface of the upper level silicon epitaxial growth.

In an implementation, the first etch can be reactive ion etching (RIE) to achieve an anisotropic etch.

In a further implementation, the method can further include, prior to the filling of the vertical opening with the conductive material, performing a second etch to enlarge a size of the exposed contact surface of the lower level silicon epitaxial growth.

In another implementation, the second etch can be an isotropic etch.

In an implementation, the conductive material can be a metal including one of Ruthenium, Tungsten, Cobalt and Molybdenum.

In a further implementation, the lower level of the unfinished CFET structure can form a positive-channel metal oxide semiconductor.

In another implementation, the lower level silicon epitaxial growth can be lower level is SiGe epitaxial growth.

In an implementation, the lower level silicon epitaxial growth can be p+ source and drain epitaxy to form p+ SiGe.

In a further implementation, the first etch can leave all of the blocking material in the vertical channel.

In another implementation, the method can further include polishing a portion of the unfinished CFET structure using a polishing technique such as chemical mechanical polishing (CMP) to remove an upper portion of the unfinished CFET structure.

In an implementation, a system is provided. The system can include a memory storing instructions for forming a complementary field effect transistor (CFET), and a processor, coupled with the memory and to execute the instructions. The instructions, when executed, can cause the processor to add a blocking material to a vertical channel of an unfinished CFET structure having a lower level silicon epitaxial growth in a lower level thereof, the blocking material being located below and in contact with a lower portion of the lower level silicon epitaxial growth, add an insulating material to an open area within the vertical channel to surround a portion of at least the lower level silicon epitaxial growth, perform a first etch to (i) remove a portion of the added insulating material, (ii) expose a contact surface of the lower level silicon epitaxial growth and (iii) provide a vertical opening within the vertical channel, the first etch leaving at least a portion of the blocking material, and fill in the vertical opening with a conductive material, the conductive material reaching the exposed contact surface of the lower level silicon epitaxial growth, the blocking material remaining below the conductive material to prevent contact between the conductive material and a silicon substrate located below the lower level silicon epitaxial growth.

In a further implementation, a non-transitory computer-readable recording medium having computer instructions recorded thereon is provided. The computer instructions, when executed on one or more processors, can cause the one or more processors to perform the various operations of the method and/or system described above.

In another implementation, a method of forming a complementary field effect transistor (CFET) is provided.

The method can include adding a blocking material to a vertical channel of an unfinished CFET structure, the blocking material being located above a buried power rail (BPR) that resides below a lower level silicon epitaxial growth on a lower level of the unfinished CFET structure, adding nitride (e.g., silicon nitride (SiN) or oxynitride (SiON)) to the vertical channel above the added blocking material, performing an etch to remove the nitride to form a space for vertical strapping between a negative-channel metal oxide semiconductor gate and a positive-channel metal oxide semiconductor gate of the unfinished CFET structure, the etch leaving at least a portion of the blocking material in the vertical channel to insulate the BPR, and filling in a space created by the etch with a conductive material, such that an etch stop layer formed of the blocking material remains between the conductive material and the BPR to provide electrical insulation.

In an implementation, the etching can be reactive ion etching (RIE) to achieve an anisotropic etch.

In another implementation, the conductive material can be a metal including one of Ruthenium, Tungsten, Cobalt and Molybdenum.

In a further implementation, the lower level of the unfinished CFET structure can form a positive-channel metal oxide semiconductor.

In an implementation, a non-transitory computer-readable recording medium having computer instructions recorded thereon is provided. The computer instructions, when executed on one or more processors, can cause the one or more processors to perform the various operations of the method.

In another implementation, a system is provided. The system can include a memory storing instructions for forming a complementary field effect transistor (CFET), and a processor, coupled with the memory and to execute the instructions. The instructions, when executed, can cause the processor to perform the various operations of the method described above.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Aspects of the present disclosure relate to self-limiting manufacturing techniques to prevent electrical shorts in a complementary field effect transistor (CFET). One unique aspect of a CFET, in comparison to a single transistor stack, is the manufacturing sequence of forming a lower level stack and an upper level stack and interconnections between the two levels. The technology disclosed provides a process of manufacturing a CFET including interconnections between the two levels of the CFET.

Specifically, the technology disclosed corresponds to process integration schemes to ensure a robust vertical etch process to provide high-aspect ratio contact hole opening for creating vertical connections between upper and level stacks within the CFET structure. High-aspect ratio refers to the ratio of contact hole depth to diameter in the range of 5-10 in CFET manufacturing processes. The technology disclosed uses etch-stop material, with high-etch selectivity relative to other exposed materials. In other words, the etch-stop material has a very low or almost zero etch rate, as compared with other exposed materials. The technology disclosed also yields wider process margin and greater yield for when manufacturing CFETs. A wider process margin means that the etch process is tolerant to fluctuation of process conditions and able to yield required results from run to run.

The vertical strappings between lower level and upper level transistors in the CFET structure (e.g., connecting upper level and lower level gates of vertical transistors of the CFET architecture) is a unique feature of CFET technology and manufacturing a reliable CFET with vertical strappings is challenging. The technology disclosed implements self-limiting techniques to improve robustness of the process of manufacturing a CFET including vertical strappings. Further, the technology disclosed improves the robustness by using etch-stop material to minimize a potential to short contacts to materials of the CFET, such as underlying lower and upper level epitaxies, conductors, substrates, etc.

The self-limiting etch concept can be applied during various phases of the CFET manufacturing process. The technology disclosed provides two examples describing the use of an etch stop layer for self-limit etching to prevent an undesirable contact opening, leading to a more robust manufacturing process. The first example includes providing an etch-stop at a bottom of a lower level source and/or drain epitaxial growth at the lower level of the CFET structure (see FIGS. 2A and 2B) and the second example includes providing an etch-stop over a buried power rail (BPR) of the CFET structure (see FIG. 4).

Figure 1A:
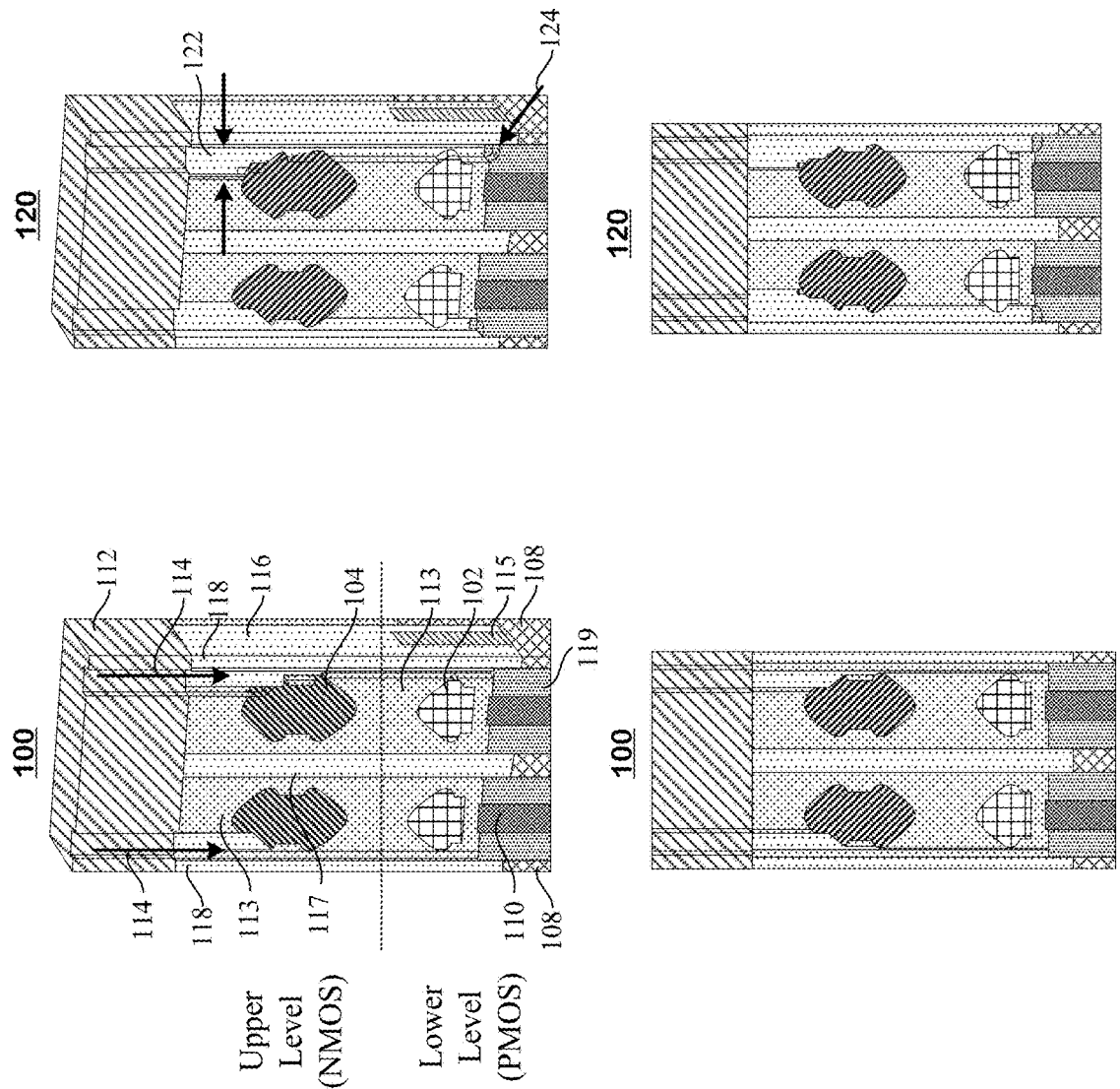
FIGS. 1A and 1B illustrate an unfinished complementary field effect transistor (CFET) structure, in which overetching has occurred, which results in the formation of too narrow of a gap between a metal contact and a silicon substrate that increases a risk of an electrical short.
Figure 1B:
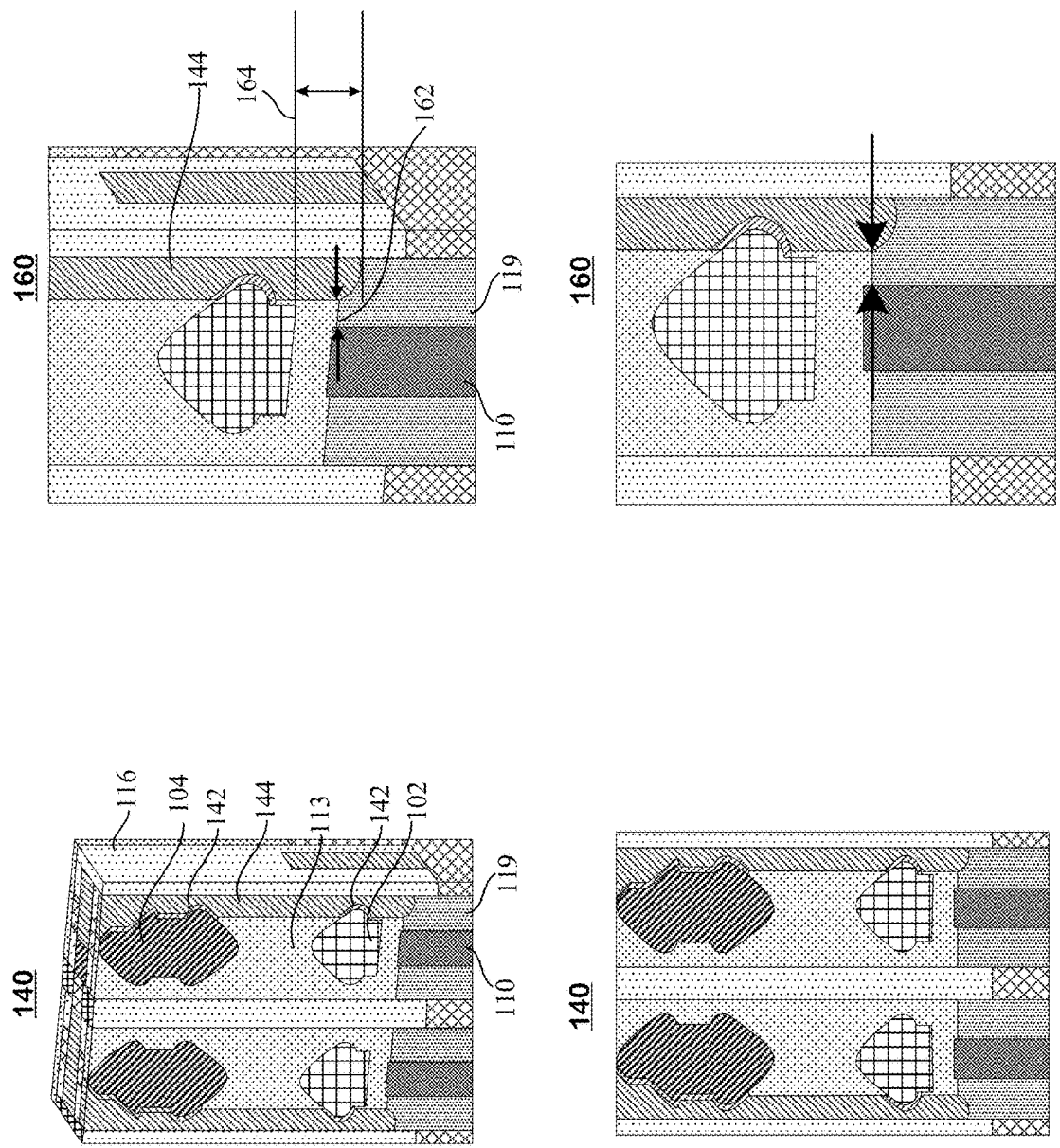

FIGS. 1A and 1B illustrate an unfinished complementary field effect transistor (CFET) structure, in which overetching has occurred, which results in the formation of too narrow of a gap between a metal contact and a silicon substrate that increases a risk of an electrical short.

Specifically, FIGS. 1A and 1B illustrate a process in which unwanted over-etching has occurred. The process includes operation 100, in which one or more contact holes 114 are etched into the CFET. Before going into further detail regarding operation 100, the structure of the unfinished CFET illustrated in FIGS. 1A and 1B will be described.

As mentioned above, the CFET structure includes one or more contact holes 114, which are vertical channels. The CFET structure includes source and drain epitaxy at two levels (e.g., an upper level and a lower level), both levels being above a buried power rail (BPR) 108 of the CFET structure (see dotted line illustrated in operation 100 distinguishing the upper level from the lower level). A BPR can include metal wires located below an active part of the CFET that are for routing power and ground lines to other components. The upper level can be a negative-channel metal oxide semiconductor (NMOS) and the lower level of the CFET structure can be a positive-channel metal oxide semiconductor (PMOS). Alternatively, the upper level can be PMOS and the lower level can be an NMOS.

While the distinction between the upper level and the lower level is not explicitly illustrated in each of FIGS. 1A through 4, each of the CFET structures illustrated therein include the upper level and the lower level. The upper level can include an upper level silicon epitaxial growth 104 that can be an n+ source and drain epitaxy (e.g., n+ doped silicon). The lower level can include the lower level silicon epitaxial growth 102 that can be a p+ source and drain epitaxy (e.g., p+ SiGe).

The CFET structure can also include the blocking material 113 that insulates the lower level silicon epitaxial growth 102 from the upper level silicon epitaxial growth 104, as well as other layers and/or materials of the CFET structure. The blocking material 113 can include at least one of a carbon-based material, an oxide (e.g., aluminum oxide), silicon nitride-base materials, and carbon-doped silicon oxide (SiCOH). The CFET structure can also include a hard mask 112 above the upper level and can also include a silicon substrate 110 below the lower level. The hard mask 112 can be used as opposed to photoresist (soft mask) as part of lithography process, which typically starts with patterned photoresist, followed by etch to transfer pattern onto a material (hardmask), which in turn, after photoresist removal, serves as a patterned layer for further transfer of pattern to lower level structure by etch.

Silicon substrate is the body of silicon wafer on which everything builds. The CFET structure further includes silicon nitride (SiN) or oxynitride (SiON) 116 that is used to form, for example, a vertical divider 117 between the sources and the drains of the upper and lower levels. The CFET can also include vertical dividers 118 located to the left and right of the vertical divider 117. These vertical dividers 117, 118 can form a vertical channel into which the blocking material 113 is added. The CFET structure can also include a silicon oxide shallow trench isolation (STI) 119 located below the lower level silicon epitaxial growth 102 and can also include tungsten 115 formed to connect a CFET gate to the BPR 108.

As illustrated in operation 100, the contact holes 114 are etched through the hard mask 112 and the blocking material 113 to expose portions of the upper level silicon epitaxial growth 104 and portions of the lower level silicon epitaxial growth 102 to the contact hole 114.

In operation 120 the etching of the contact holes 114 continues, such that a width 122 of the contact holes 114 increases and additional portions of the lower level silicon epitaxial growth 102 are exposed to the contact holes 114, as well as other components of the CFET, such as the silicon oxide (STI) 119. A problem can arise when the etching of one or more of the contact holes 114 (i) creates a width 122 that is too wide, which can expose unwanted portions of the CFET structure and/or (ii) creates an etch that is too deep 124 that goes into the silicon oxide (STI) 119. As illustrated, a portion of the STI 119 is removed by this over etching, thus created a gap that places the contact hole 114 closer to the silicon substrate 110. Such a narrow gap should be avoided to prevent electrical shorts.

In operation 140, a contact material 142, such as Ti or TiSi, can be added to at least a portion of the exposed portion of the lower level silicon epitaxial growth 102 and/or the upper level silicon epitaxial growth 104. Operation 140 also includes adding a conductive material 144 to the contact holes 114, such that the conductive material 144 is in contact with the contact material 142 as well as the blocking material 113, the nitride 116 and the silicon oxide (STI) 119. This contact material 142 and the conductive material 144 can form a wrap-around contact with the lower level silicon epitaxial growth 102 and the upper level silicon epitaxial growth 104. The operation of adding the contact material 142 can be omitted and the conductive material 144 can be added without the use of the contact material 142. The conductive material 144 can be comprised of, at least one of, Ruthenium, Tungsten, Cobalt, Molybdenum, etc. This operation 140 can include completely filling the contact holes 114 with the conductive material 144 or partially filling in at least a portion of the contact holes 114 with the conductive material 144 so that the exposed portions of the lower level silicon epitaxial growth 102 and the upper level silicon epitaxial growth 104 are covered by the conductive material 144.

Reference element 160 of FIG. 1B illustrates that too narrow of a gap 162 is formed between the conductive material 144 and the silicon substrate 110. This narrow gap 162 is formed in operations 100 and 120 in which, after the etching of the contact holes 114, the blocking material 113 or nitride 116 is etched (isotropically or other forms) to expose more portions of the lower level silicon epitaxial growth 102 and the upper level silicon epitaxial growth 104 in order to improve an electrical contact formation using the conductive material 144 to be added. As illustrated, this relatively high aspect ratio contact etch may pass below the lower level silicon epitaxial growth 102 by distance 164, approaching the adjacent silicon substrate 110 and potentially resulting in an electrical short. Reference element 160 illustrates the over etching of the distance 164 that has occurred, resulting in the narrow gap 162.

Figure 2A:
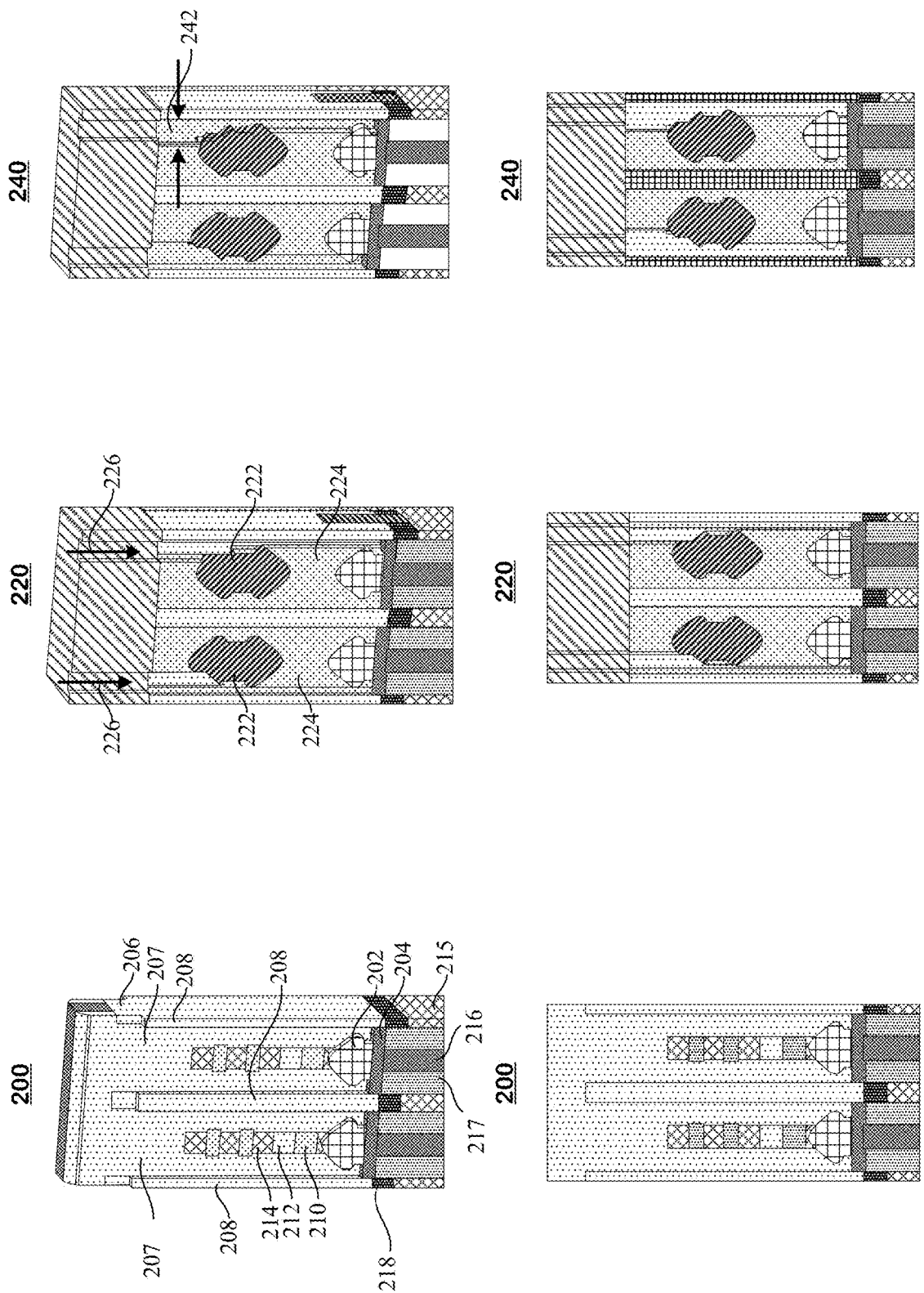
FIGS. 2A and 2B illustrate an unfinished CFET structure in which blocking material is applied to a lower level of the CFET structure by implementing an etch-stop at a bottom of a source and drain epitaxial growth of the lower level of the CFET structure.
Figure 2B:
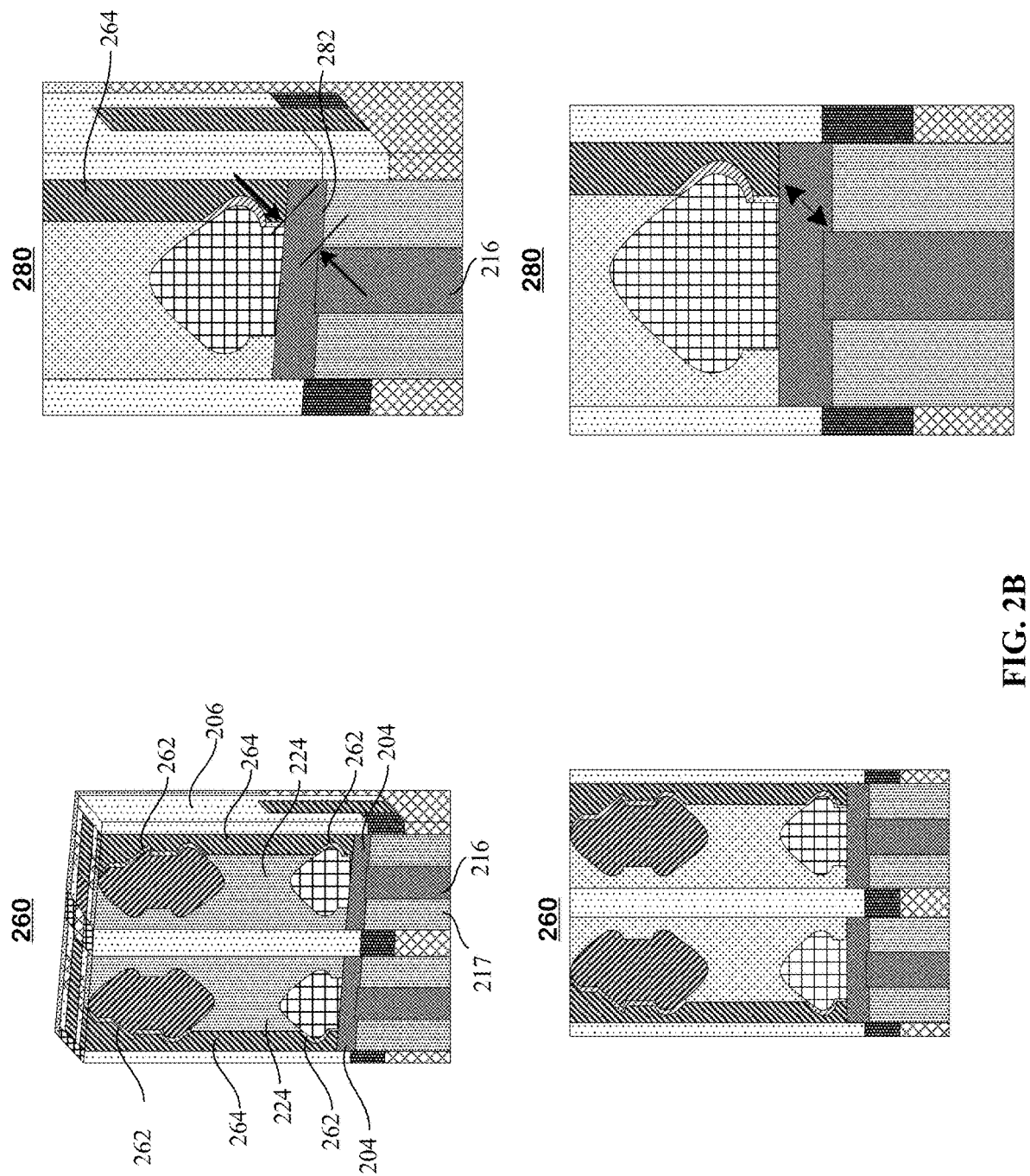

FIGS. 2A and 2B illustrate an unfinished CFET structure in which blocking material is applied to a lower level of the CFET structure by implementing an etch-stop at a bottom of a source and drain epitaxial growth of the lower level of the CFET structure.

This process of implementing the etch-stop includes operation 200 of adding a blocking material 204 to an unfinished CFET structure. The unfinished CFET structure of FIG. 2A is similar to the unfinished CFET structures of FIGS. 1A and 1B and redundant descriptions thereof are omitted. Specifically, the unfinished CFET structure of FIG. 2A includes a lower level silicon epitaxial growth 202 and a blocking material 204. The lower level silicon epitaxial growth 202 can be a p+ source and drain epitaxy (e.g., p+ SiGe) that forms a positive-channel metal oxide semiconductor (PMOS).

This blocking material 204 (e.g., the etch stop layer) can come from remaining blocking material used in a previous epitaxy process for growing the lower level silicon epitaxial growth 202. Further, the blocking material 204 can be formed by filling up vertical channels 207 and etching back to a level below silicon epitaxy growth 202, while covering silicon substrate 216 and silicon oxide STI 217. Example materials for the blocking material 204 can include Carbon, AlO, SiN, etc. The blocking material 204 can further be comprised of SiO2. Further, the CFET structure can include a nitride 206 that is used to form, for example, one or more vertical dividers 208. One of the vertical dividers 208 (e.g., a center divider) can be located between the sources and the drains of the upper and lower levels of the CFET. Vertical dividers 208 can also be located to the left and the right of the vertical divider 208 in the center. These vertical dividers 208 can form one or more vertical channels 207.

Furthermore, the unfinished CFET can include a buried power rail (BPR) 215 located below the upper and lower levels. The BPR 215 can be comprised of Ruthenium, Molybdenum, Tungsten, etc. The unfinished CFET can also include (i) a silicon substrate 216 located below the lower level and below the blocking material 204, (ii) a silicon oxide STI 217 located below the blocking material 204 and (iii) a BPR etch-stop material (e.g., AlO) 218 located above the BPR 215.

The unfinished CFET can further include a nitride layer 212, a silicon oxide 210 layer and an inner spacer (i.e., low dielectric constant material, e.g., SiCOH) 214 layer, where layers 210, 214 and 214 are exposed in the vertical channel 207.

Operation 200 includes adding the blocking material 204 to one or more of the vertical channels 207 formed by the vertical dividers 208. The blocking material 204 can be added to be located below and in contact with a lower portion of the lower level silicon epitaxial growth 202. The blocking material 204 can be added before or after the formation of the lower level silicon epitaxial growth 202.

Operation 220 can include performing an upper level silicon epitaxial growth 222 that can be an n+ source and drain epitaxy (e.g., n+ doped silicon) that forms a negative-channel metal oxide semiconductor (NMOS). Operation 220 can further include adding an insulating material 224 to an open area within one or more of the vertical channels 207 to surround at least a portion of the lower level silicon epitaxial growth 202 and/or at least a portion of the upper level silicon epitaxial growth 222. The insulating material 224, as illustrated, can be added to be adjacent to the vertical dividers 208. Specifically, the insulating material 224 can be adjacent to the center vertical divider 208 and/or it can be adjacent to the vertical dividers 208 to the left and/or right of the center vertical divider. The insulating material 224 can be comprised of silicon oxide.

Moreover, operation 220 includes performing a first etch to (i) remove a portion of the added insulating material 224, (ii) expose one or more contact surfaces of the lower level silicon epitaxial growth 202 and/or one or more contact surfaces of the upper level silicon epitaxial growth 222, and (iii) provide a vertical opening 226 within one or more of the vertical channels 207. The first etch can leave some or all of the blocking material 204, such that the silicon oxide STI 217 is not exposed to the vertical opening 226. The first etch can be reactive ion etching (REI) to achieve an anisotropic etch.

Operation 240 can include performing a second etch to enlarge a size of the exposed contact surfaces of the lower level silicon epitaxial growth 202 and/or the upper level silicon epitaxial growth 222. As illustrated, the second etch results in a wider vertical channel 242, as compared to the first etch. The second etch can leave some or all of the blocking material 204, such that the silicon oxide STI 217 is not exposed to the wider vertical channel 242. The second etch can be an isotropic etch, by plasma or wet chemical etch.

Operation 260 can include adding a contact material 262, such as Ti or TiSi, to at least a portion of the exposed contact surfaces of the lower level silicon epitaxial growth 202 and/or the upper level silicon epitaxial growth 222. Operation 260 also includes adding (filling in) a conductive material 264 in the vertical channel 242 (e.g., a vertical opening), such that the conductive material 264 is in contact with the contact material 262, the insulating material 224, the nitride 206, as well as the blocking material 204. Specifically, the conductive material 264 can be added, such that it reaches some or all of the exposed contact surfaces of the lower level silicon epitaxial growth 202 and/or the upper level silicon epitaxial growth 222 (or the contact material 262 that is in contact with these exposed contact surfaces). This contact material 262 and the conductive material 264 can form a wrap-around contact with the lower level silicon epitaxial growth 202 and the upper level silicon epitaxial growth 222. The operation of adding the contact material 262 can be omitted and the conductive material 264 can be added without the use of the contact material 262. The conductive material 264 can be comprised of, at least one of, Ruthenium, Tungsten, Cobalt, Molybdenum, etc. This operation 260 can include completely filling the vertical channel 242 with the conductive material 264 or partially filling in at least a portion of the vertical channel 242 with the conductive material 264 so that the exposed portions of the lower level silicon epitaxial growth 202 and the upper level silicon epitaxial growth 222 are covered by the conductive material 264. During this operation, some or all of the blocking material 204 remains below the conductive material 264 to prevent contact between the conductive material 264 and the silicon substrate 216 below the lower level silicon epitaxial growth 202.

Reference element 280 illustrates the distance 282 between the conductive material 264 and the silicon substrate 216, as a result of the blocking material 204. This distance 282 ensures that there will not be an electrical connection or short between the conductive material 264 and the silicon substrate 216. As illustrated, the distance 282 is much larger than the gap (distance) 162 between the conductive material 144 and the silicon substrate 110 of FIG. 1B.

This process described with reference to FIGS. 2A and 2B can further include polishing, such as chemical mechanical polishing (CMP), to remove upper portion of CFET structure until it stops at nitride 206.

Figure 3:
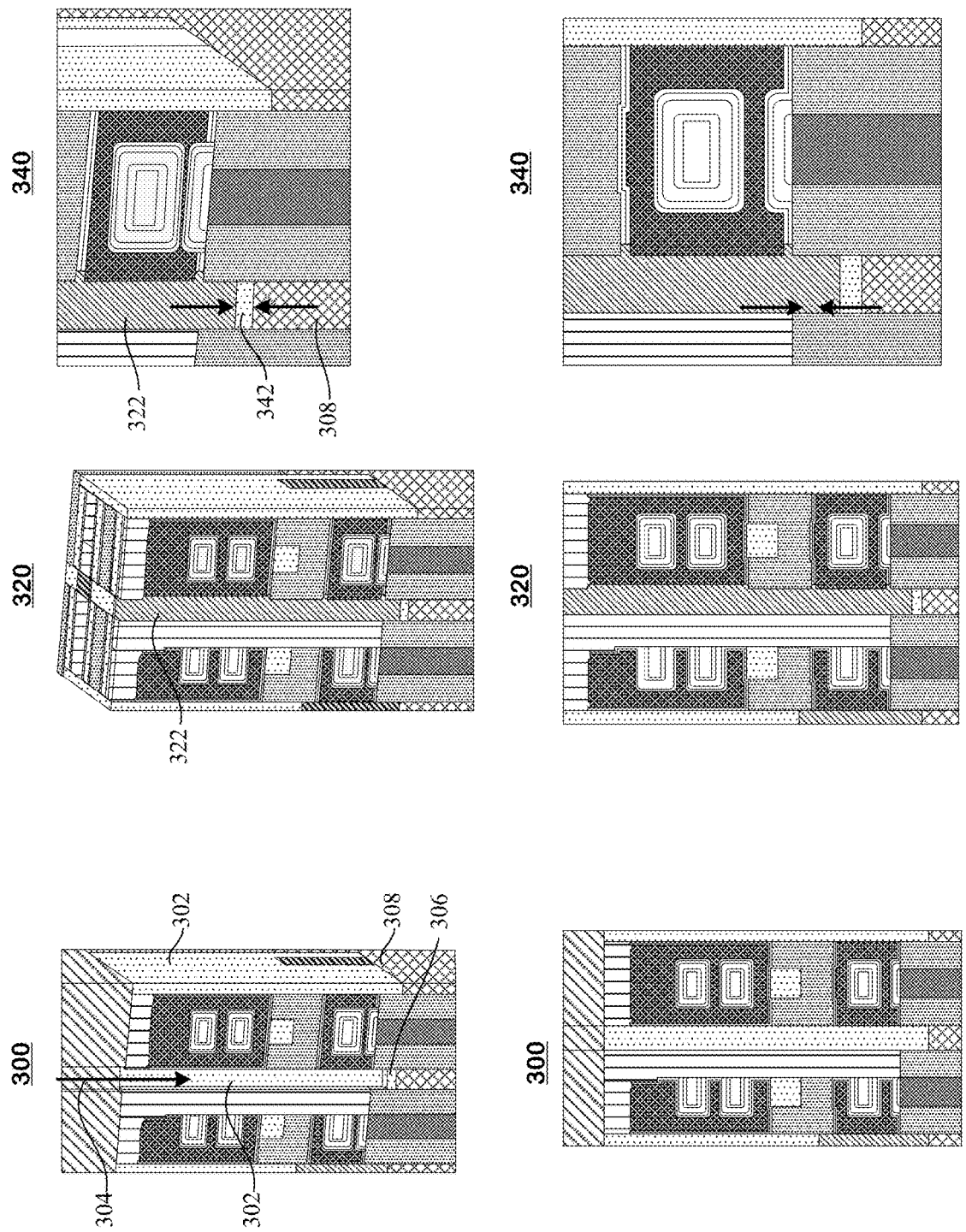
FIG. 3 illustrates an unfinished CFET structure in which vertical strapping of an n-channel metal oxide semiconductor (NMOS) and a p-channel metal oxide semiconductor (PMOS) can potentially short to an underlying buried power rail (BPR) as a result of using a timed etch, leaving too thin a nitride layer between a vertical strap and BPR.

FIG. 3 illustrates an unfinished CFET structure in which vertical strapping of an n-channel metal oxide semiconductor (NMOS) and a p-channel metal oxide semiconductor (PMOS) can potentially short to an underlying buried power rail (BPR) as a result of using a timed etch, leaving too thin a nitride layer between a vertical strap and BPR.

The unfinished CFET structure of FIG. 3 is similar to the unfinished CFET structures of FIGS. 1A, 1B, 2A and 2B and redundant descriptions thereof are omitted. In particular, FIG. 3 illustrates, a nitride 302, a vertical channel 304, a nitride layer 306 and a buried power rail (BPR) 308.

Specifically, FIG. 3 illustrates a problem associated with a contact etch to vertically strap NMOS and PMOS gates. Operation 300 includes performing an etch to form the vertical channel 304, leaving a thin nitride layer 306 between the vertical channel 304 and the BPR 308. In other words, if the etch is overdone (i.e., extends further than intended), then there is a risk of an unwanted electrical short to the underlying BPR 308.

Operation 320 includes adding a conductive material 322 to the vertical channel 304 to form the vertical strap. Reference element 340 illustrates the small distance 342 between the conductive material 322 (vertical strap) and the BPR 308. When forming a CFET structure, this vertical strapping, which adds a vertical channel of the conductive material 322, is necessary. However, as illustrated in FIG. 3, it is difficult to form the vertical strapping such that the vertical strapping does not contact the BPR 308, because it is difficult to precisely control the depth of the vertical etch.

Figure 4:
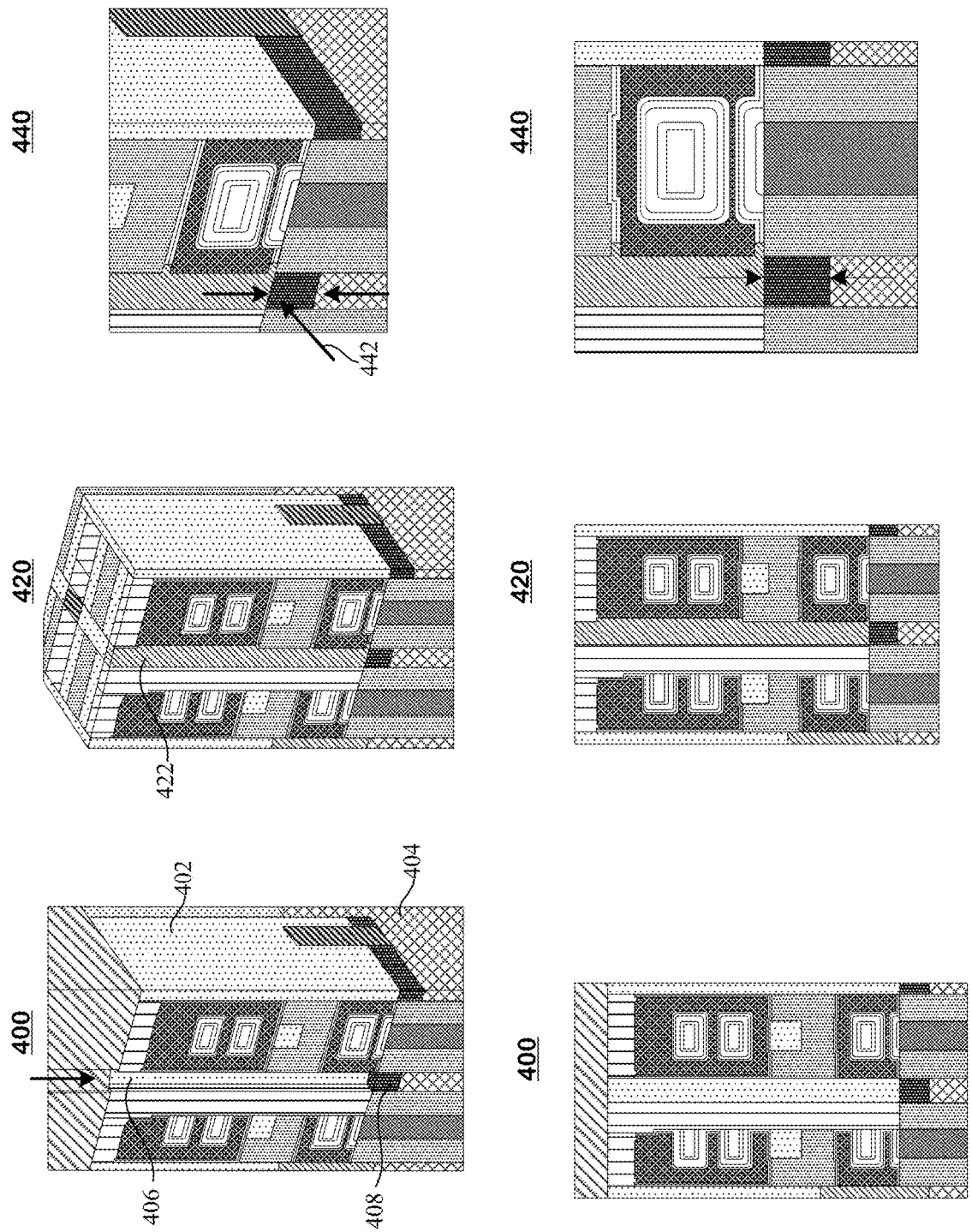
FIG. 4 illustrates a CFET structure in which an etch-stop layer on top of the BPR is retained as a result of a self-limiting etch.

FIG. 4 illustrates an unfinished CFET structure in which a thin etch-stop layer is formed (or retained) on top of the BPR as a result of a self-limiting etch.

The unfinished CFET structure of FIG. 4 is similar to the unfinished CFET structures of FIGS. 1A, 1B, 2A, 2B and 3, and redundant descriptions thereof are omitted. In particular, FIG. 4 illustrates, a nitride 402, a buried power rail (BPR) 404, a vertical channel 406, and blocking material 408.

FIG. 4 illustrates the solution to the problem illustrated in FIG. 3 with respect to vertically strapping, for example, NMOS and PMOS gates of the unfinished CFET structure. In FIG. 4, operation 400 includes adding the blocking material 408 (e.g., an etch stop layer) to the vertical channel 406 of the unfinished CFET structure. The blocking material 408 is located above the BPR 404 that resides below a lower level silicon epitaxial growth on a lower level of the unfinished CFET structure. The blocking material 408 can be composed of AlO, AlON, SiON, etc. In operation 400 a nitride (e.g., silicon nitride (SiN) or oxynitride (SiON)) can be added to the vertical channel 406 above the blocking material 408, and then an etch (e.g., an RIE etch) can be performed to remove the nitride to form a space for vertically strapping between an NMOS gate and a PMOS gate of the unfinished CFET structure. The etch can leave at least a portion of the blocking material 408 in the vertical channel 406. Because of the presence of the blocking material 408, it does not matter if the etching removes all of the added nitride.

Operation 420 includes filling in the space (e.g., the vertical channel 406) created by the etching with a conductive material 422, leaving an etch stop layer formed of the blocking material 408 between the conductive material 422 and the BPR 404. Reference element 440 illustrates the distance 442 between the conductive material 422 and the BPR 404, in contrast to the short distance 342 between the conductive material 322 and the BPR 308, as illustrated in FIG. 3.

Figure 5A:
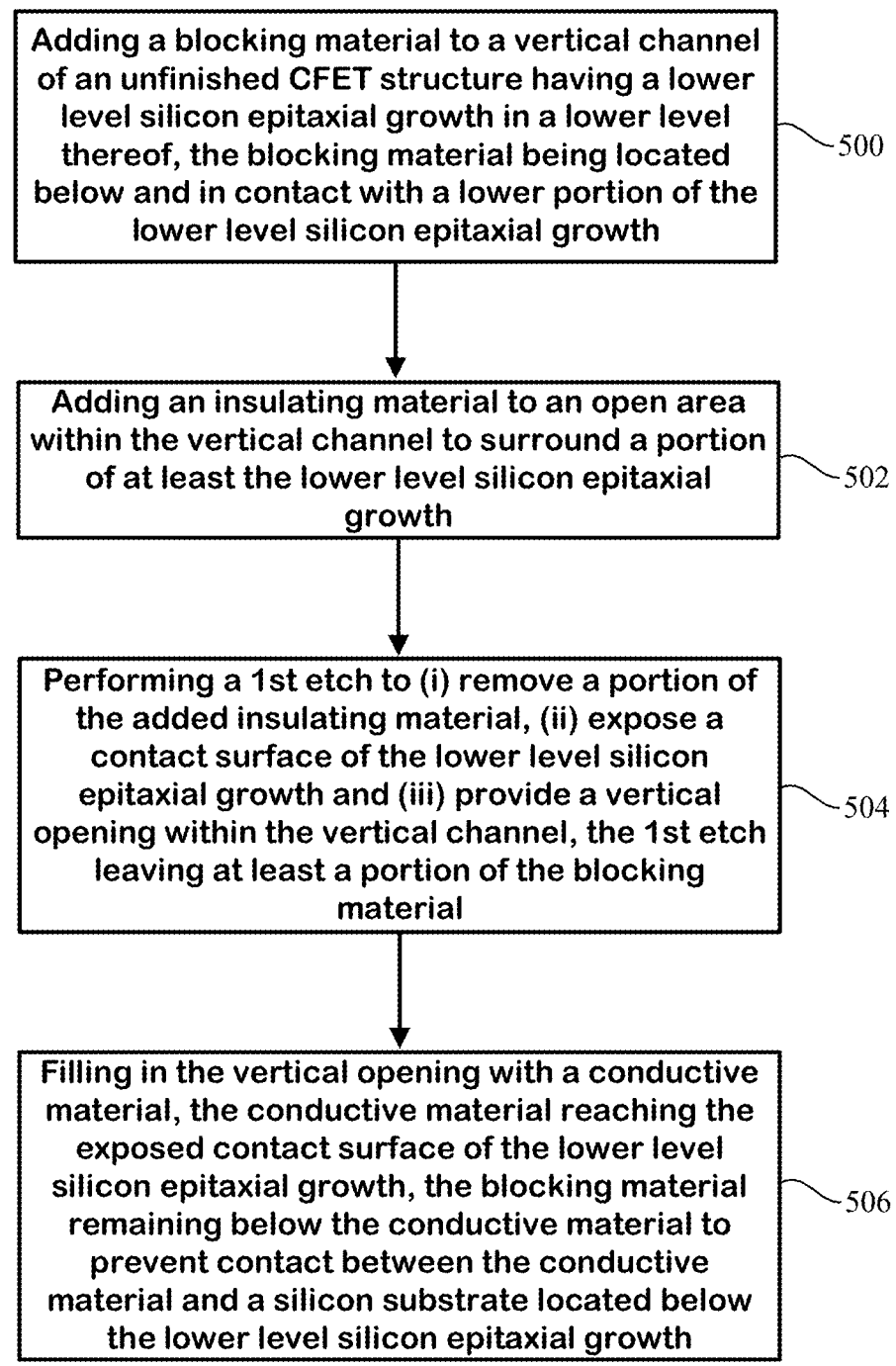
FIGS. 5A and 5B illustrate flowcharts describing operations for forming a CFET
Figure 5B:
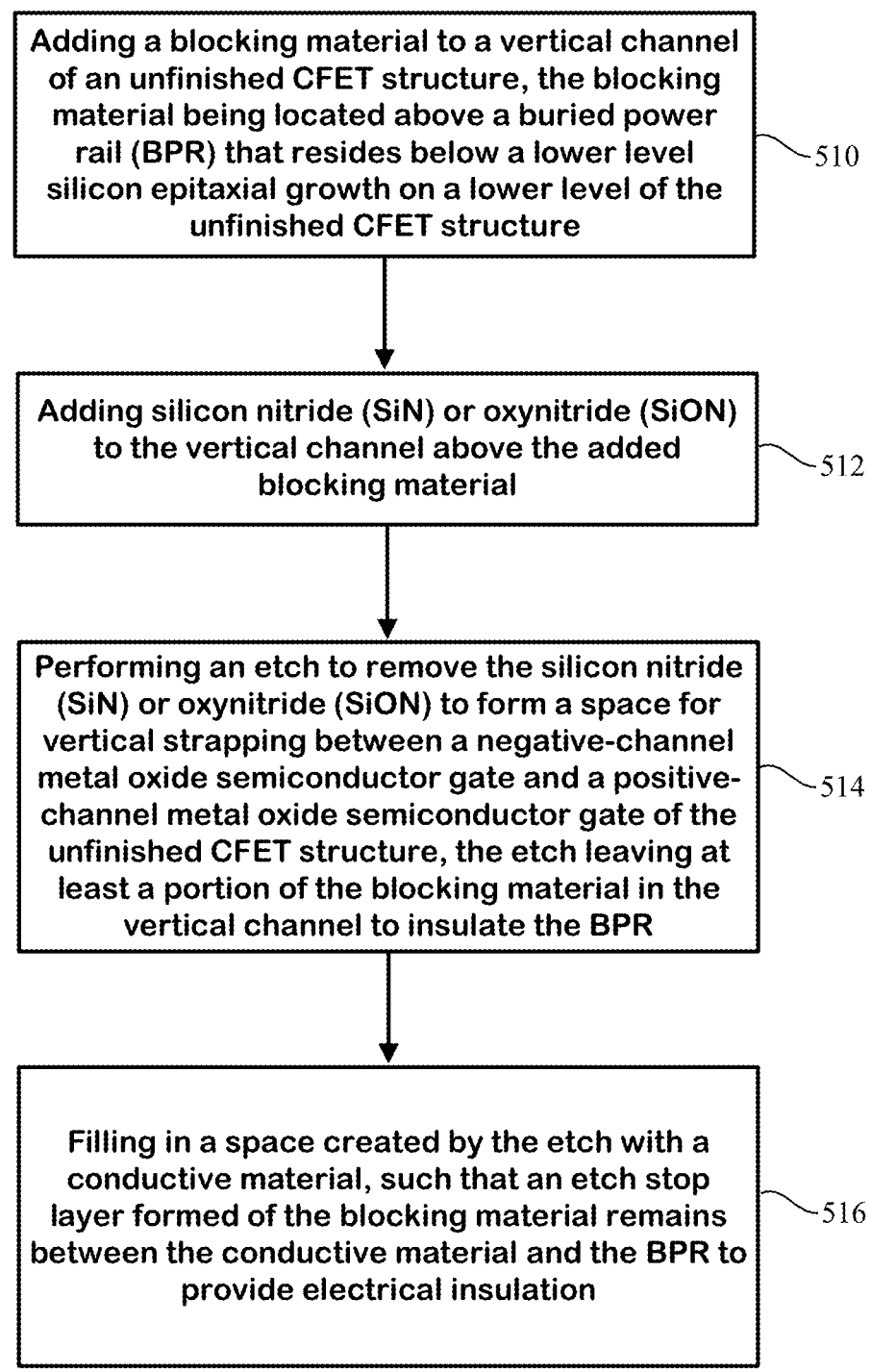

FIGS. 5A and 5B illustrate flowcharts describing operations for forming a CFET. In FIG. 5A the operations can include an operation 500 of adding a blocking material to a vertical channel of an unfinished CFET structure having a lower level silicon epitaxial growth in a lower level thereof, the blocking material being located below and in contact with a lower portion of the lower level silicon epitaxial growth. The operations can include an operation 502 of adding an insulating material to an open area within the vertical channel to surround a portion of at least the lower level silicon epitaxial growth. The operations can further include an operation 504 of performing a first etch to (i) remove a portion of the added insulating material, (ii) expose a contact surface of the lower level silicon epitaxial growth and (iii) provide a vertical opening within the vertical channel, the first etch leaving at least a portion of the blocking material. The operations can also include an operation 506 of filling in the vertical opening with a conductive material, the conductive material reaching the exposed contact surface of the lower level silicon epitaxial growth, the blocking material remaining below the conductive material to prevent contact between the conductive material and a silicon substrate located below the lower level silicon epitaxial growth.

In FIG. 5B the operations can include an operation 510 of adding a blocking material to a vertical channel of an unfinished CFET structure, the blocking material being located above a buried power rail (BPR) that resides below a lower level silicon epitaxial growth on a lower level of the unfinished CFET structure. The operations can further include an operation 512 adding silicon nitride (SiN) or oxynitride (SiON) to the vertical channel above the added blocking material. The operations can also include an operation 514 of performing an etch to remove the silicon nitride (SiN) or oxynitride (SiON) to form a space for vertical strapping between a negative-channel metal oxide semiconductor gate and a positive-channel metal oxide semiconductor gate of the unfinished CFET structure, the etch leaving at least a portion of the blocking material in the vertical channel to insulate the BPR. The operations may also include an operation 516 of filling in a space created by the etch with a conductive material, such that an etch stop layer formed of the blocking material remains between the conductive material and the BPR to provide electrical insulation.

Figure 6:
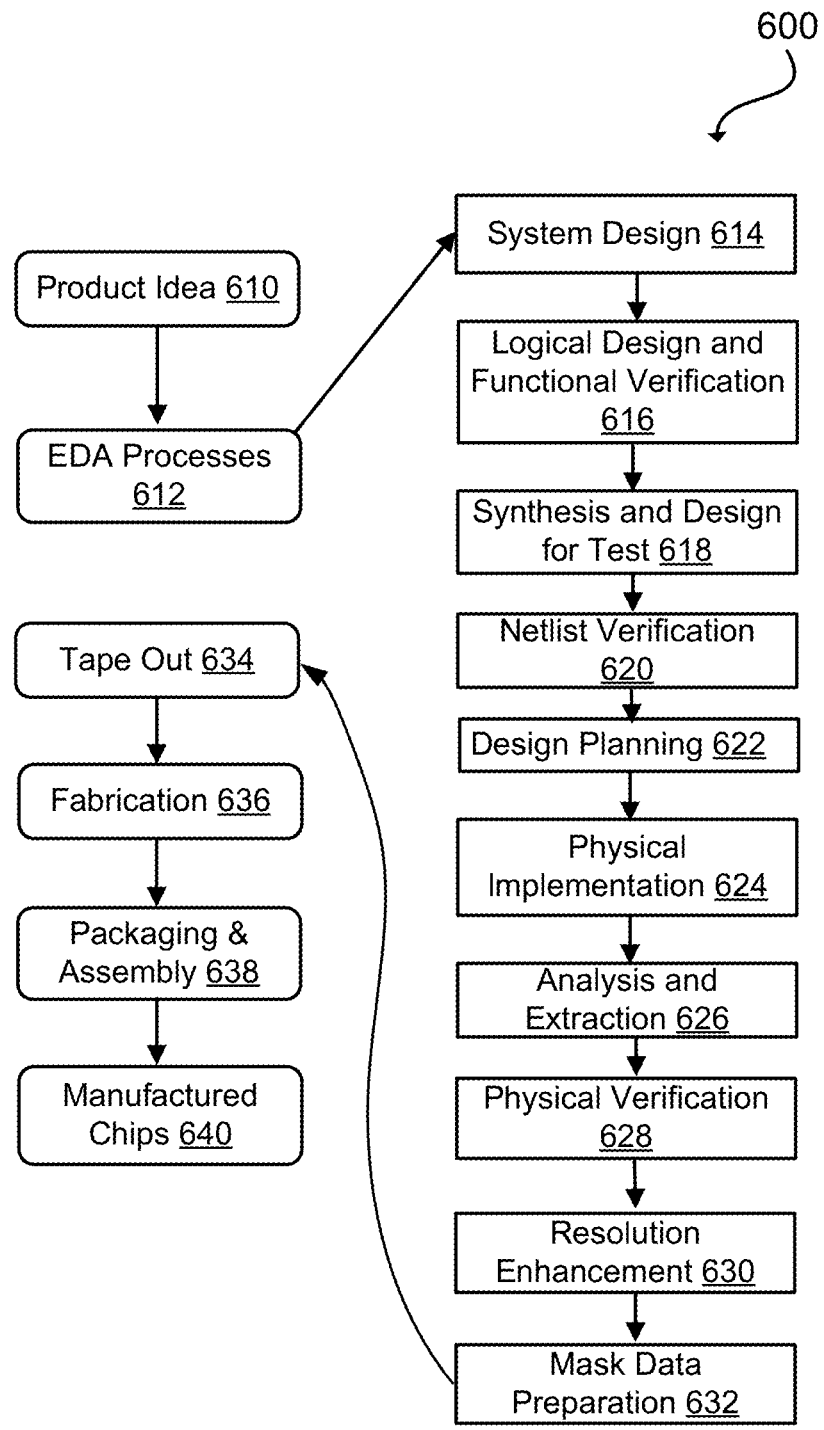
FIG. 6 depicts a flowchart of various processes used during the design and manufacture of an integrated circuit in accordance with some embodiments of the present disclosure.

FIG. 6 illustrates an example set of processes 600 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 610 with information supplied by a designer, information which is transformed to create an article of manufacture that uses a set of EDA processes 612. When the design is finalized, the design is taped-out 634, which is when artwork (e.g., geometric patterns) for the integrated circuit is sent to a fabrication facility to manufacture the mask set, which is then used to manufacture the integrated circuit. After tape-out, a semiconductor die is fabricated 636 and packaging and assembly processes 638 are performed to produce the finished integrated circuit 640. The processes described above with respect to the unfinished CFET structure can be carried out during this fabrication stage 636.

Specifications for a circuit or electronic structure may range from low-level transistor material layouts to high-level description languages. A high-level of abstraction may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower abstraction level that is a less abstract description adds more useful detail into the design description, for example, more details for the modules that include the description. The lower levels of abstraction that are less abstract descriptions can be generated by a computer, derived from a design library, or created by another design automation process. An example of a specification language at a lower level of abstraction language for specifying more detailed descriptions is SPICE, which is used for detailed descriptions of circuits with many analog components. Descriptions at each level of abstraction are enabled for use by the corresponding tools of that layer (e.g., a formal verification tool). A design process may use a sequence depicted in FIG. 6. The processes described may be enabled by EDA products (or tools).

During system design 614, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 616, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 618, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 620, the netlist is checked for compliance with timing constraints and for correspondence with the HDL code. During design planning 622, an overall floor plan for the integrated circuit is constructed and analyzed for timing and top-level routing.

During layout or physical implementation 624, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flipflop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 626, the circuit function is verified at the layout level, which permits refinement of the layout design. During physical verification 628, the layout design is checked to ensure that manufacturing constraints are correct, such as DRC constraints, electrical constraints, lithographic constraints, and that circuitry function matches the HDL design specification. During resolution enhancement 630, the geometry of the layout is transformed to improve how the circuit design is manufactured.

During tape-out, data is created to be used (after lithographic enhancements are applied if appropriate) for production of lithography masks. During mask data preparation 632, the 'tape-out' data is used to produce lithography masks that are used to produce finished integrated circuits.

A storage subsystem of a computer system (such as computer system 700 of FIG. 7) may be used to store the programs and data structures that are used by some or all of the EDA products described herein, and products used for development of cells for the library and for physical and logical design that use the library.

Figure 7:
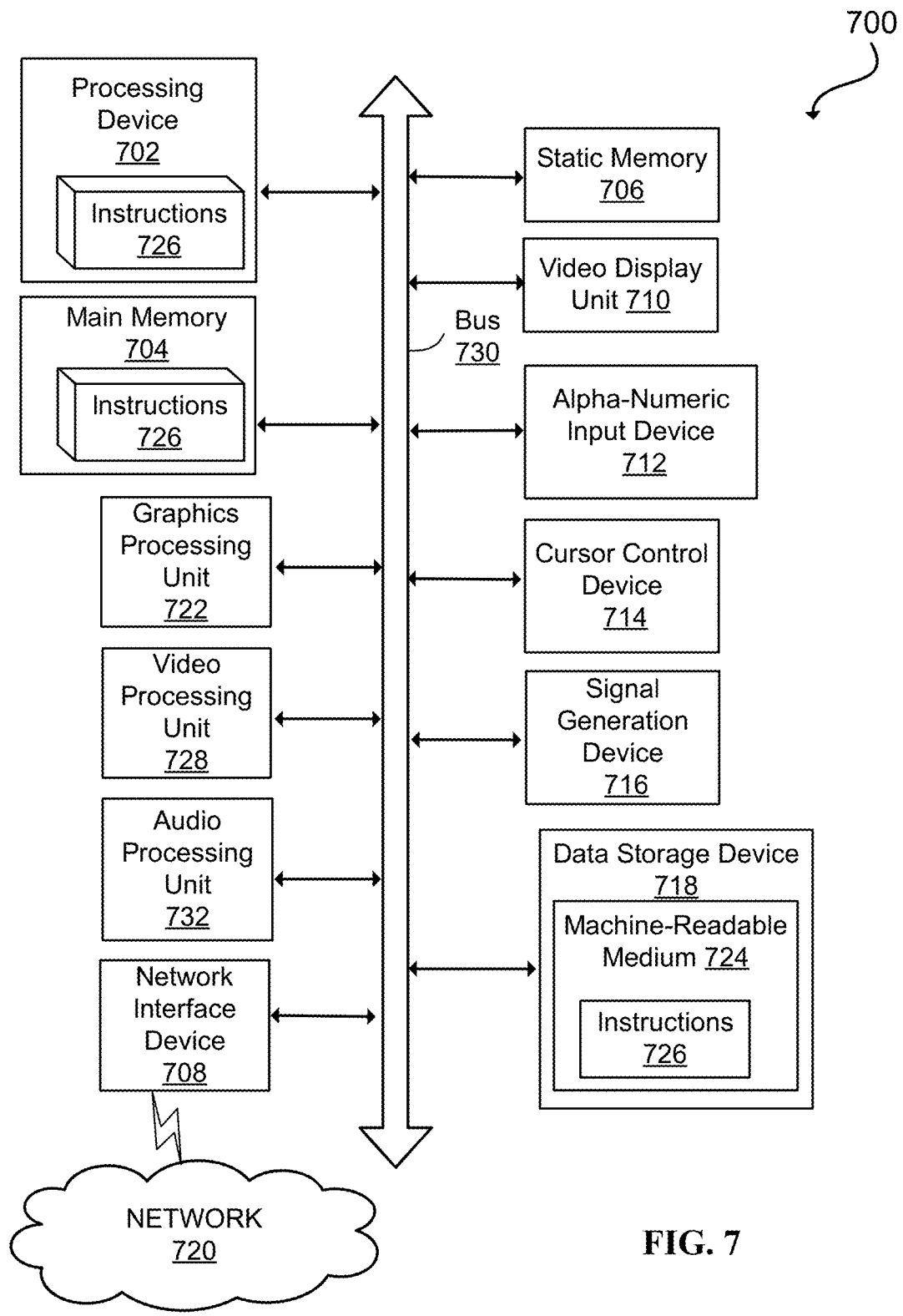
FIG. 7 depicts an abstract diagram of an example computer system in which embodiments of the present disclosure may operate.

FIG. 7 illustrates an example machine of a computer system 700 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM), a static memory 706 (e.g., flash memory, static random access memory (SRAM), etc.), and a data storage device 718, which communicate with each other via a bus 730.

Processing device 702 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 may also be one or more special-purpose processing devices such as an application specific integrated circuit (ASIC), a field programmable gate array (FPGA), a digital signal processor (DSP), network processor, or the like. The processing device 702 may be configured to execute instructions 726 for performing the operations and steps described herein.

The computer system 700 may further include a network interface device 708 to communicate over the network 720. The computer system 700 also may include a video display unit 710 (e.g., a liquid crystal display (LCD) or a cathode ray tube (CRT)), an alphanumeric input device 712 (e.g., a keyboard), a cursor control device 714 (e.g., a mouse), a graphics processing unit 722, a signal generation device 716 (e.g., a speaker), graphics processing unit 722, video processing unit 728, and audio processing unit 732.

The data storage device 718 may include a machine-readable storage medium 724 (also known as a non-transitory computer-readable medium) on which is stored one or more sets of instructions 726 or software embodying any one or more of the methodologies or functions described herein. The instructions 726 may also reside, completely or at least partially, within the main memory 704 and/or within the processing device 702 during execution thereof by the computer system 700, the main memory 704 and the processing device 702 also constituting machine-readable storage media.

In some implementations, the instructions 726 include instructions to implement functionality corresponding to the present disclosure. While the machine-readable storage medium 724 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 702 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

We claim as follows:

1. A method comprising:
   adding a blocking material into a vertical region of a structure having a lower level silicon epitaxial region and a silicon substrate located below the lower level silicon epitaxial region in a lower level of the structure, the blocking material being located below and in contact with a lower portion of the lower level silicon epitaxial region, the blocking material separating the silicon substrate from the vertical region;
   adding an insulating material to an open area within the vertical region to surround a portion of at least the lower level silicon epitaxial region;
   performing a first etch to (i) remove a portion of the added insulating material, (ii) expose a contact surface of the lower level silicon epitaxial region and (iii) provide a vertical opening within the vertical region, the first etch leaving at least a portion of the blocking material, such that the silicon substrate region is not exposed to the vertical opening; and
   filling in the vertical opening with a conductive material, the conductive material reaching the exposed contact surface of the lower level silicon epitaxial region, the at least the portion of the blocking material remaining below the conductive material to prevent contact between the conductive material and the silicon substrate located below the lower level silicon epitaxial region.

2. The method of claim 1, wherein a vertical divider is located between the lower level silicon epitaxial region and another lower level silicon epitaxial region.

3. The method of claim 2, wherein the open area, to which the insulating material is added, is adjacent to the vertical divider.

4. The method of claim 1, wherein the insulating material is added to the open area to surround a portion of an upper level silicon epitaxial region in an upper level of the structure.

5. The method of claim 4, wherein the first etch further removes a further portion of the added insulating material to expose a contact surface of the upper level silicon epitaxial region.

6. The method of claim 5, wherein the conductive material reaches the exposed contact surface of the upper level silicon epitaxial region.

7. The method of claim 1, wherein the first etch is reactive ion etching (RIE) to achieve an anisotropic etch.

8. The method of claim 1, further comprising, prior to the filling of the vertical opening with the conductive material, performing a second etch to enlarge a size of the exposed contact surface of the lower level silicon epitaxial region.

9. The method of claim 8, wherein the second etch is an isotropic etch.

10. The method of claim 1, wherein the conductive material is a metal including one of Ruthenium, Tungsten, Cobalt and Molybdenum.

11. The method of claim 1, wherein the lower level of the structure forms a positive-channel metal oxide semiconductor.

12. The method of claim 1, wherein the lower level silicon epitaxial region is a SiGe epitaxial region.

13. The method of claim 12, wherein the lower level silicon epitaxial region is p+ source and drain epitaxy to form p+ SiGe.

14. The method of claim 1, wherein the first etch leaves all of the blocking material in the vertical region.

15. The method of claim 1, further comprising polishing a portion of the structure using a polishing technique to remove an upper portion of the structure.

16. A system comprising:
a memory storing instructions; and
a processor, coupled with the memory and to execute the instructions, the instructions when executed cause the processor to:
  add a blocking material to a vertical channel of a structure having a lower level silicon epitaxial growth and a silicon substrate located below the lower level silicon epitaxial region in a lower level of the structure, the blocking material being located below and in contact with a lower portion of the lower level silicon epitaxial growth, the blocking material separating the silicon substrate from the vertical region;
  add an insulating material to an open area within the vertical channel to surround a portion of at least the lower level silicon epitaxial growth;
  perform a first etch to (i) remove a portion of the added insulating material, (ii) expose a contact surface of the lower level silicon epitaxial growth and (iii) provide a vertical opening within the vertical channel, the first etch leaving at least a portion of the blocking material, such that the silicon substrate region is not exposed to the vertical opening; and
  fill in the vertical opening with a conductive material, the conductive material reaching the exposed contact surface of the lower level silicon epitaxial growth, the blocking material remaining below the conductive material to prevent contact between the conductive material and the silicon substrate located below the lower level silicon epitaxial growth.

* * * * *